United States Patent
Kim et al.

(10) Patent No.: US 10,229,791 B2
(45) Date of Patent: Mar. 12, 2019

(54) METHOD FOR PREPARING A BONDED TYPE PEROVSKITE SOLAR CELL

(71) Applicants: HYUNDAI MOTOR COMPANY, Seoul (KR); University-Industry Cooperation Group of Kyung Hee University, Yongin-si, Gyeonggi-do (KR)

(72) Inventors: Sol Kim, Suwon-si (KR); Mi Yeon Song, Seoul (KR); Sang Hak Kim, Seoul (KR); Eun Yeong Lee, Seoul (KR); Moon Jung Eo, Suwon-si (KR); Sang Hyuk Im, Yongin-si (KR); Hye Ji Han, Suwon-si (KR)

(73) Assignees: Hyundai Motor Company, Seoul (KR); University-Industry Cooperation Group of Kyung Hee University, Yongin-si (KR)

( * ) Notice: Subject to any disclaimer, the term of this patent is extended or adjusted under 35 U.S.C. 154(b) by 10 days.

(21) Appl. No.: 15/419,604

(22) Filed: Jan. 30, 2017

(65) Prior Publication Data
US 2018/0122584 A1 May 3, 2018

(30) Foreign Application Priority Data
Nov. 3, 2016 (KR) .................. 10-2016-0145867

(51) Int. Cl.
*H01G 9/00* (2006.01)
*H01G 9/20* (2006.01)
(Continued)

(52) U.S. Cl.
CPC .......... *H01G 9/0029* (2013.01); *H01G 9/2009* (2013.01); *H01L 51/0007* (2013.01);
(Continued)

(58) Field of Classification Search
CPC . H01L 51/42; H01L 51/4206; H01L 51/4213; H01L 51/424; H01L 51/4246;
(Continued)

(56) References Cited

U.S. PATENT DOCUMENTS

2015/0325719 A1* 11/2015 Wijdekop ........... H01L 51/4226
136/256
2016/0005987 A1* 1/2016 Koposov ............. H01L 51/4226
136/263
(Continued)

FOREIGN PATENT DOCUMENTS

KR 10-1608281 B1 4/2016
KR 10-2016-0105120 A 9/2016

OTHER PUBLICATIONS

Eperon et al.; "Neutral Color Semitransparent Microstructured Perovskite Solar Cells"; ACS Nano; 2014; 8 pp.; vol. 8; 591-598; Published online 10.1021/nn4052309; www.acsnano.org.
(Continued)

*Primary Examiner* — Bac Au
(74) *Attorney, Agent, or Firm* — Lempia Summerfield Katz LLC

(57) ABSTRACT

A method for preparing a perovskite solar cell by a non-deposition method is provided. Particularly, the method includes preparing a first substrate by forming a hole transport layer on a light absorbing layer in a semi-dried state and pressurizing and drying a second substrate including an opposing electrode to the first substrate.

13 Claims, 2 Drawing Sheets

(51) Int. Cl.
*H01L 51/00* (2006.01)
*H01L 51/42* (2006.01)
*H01L 51/44* (2006.01)

(52) U.S. Cl.
CPC ...... *H01L 51/0024* (2013.01); *H01L 51/0032* (2013.01); *H01L 51/0035* (2013.01); *H01L 51/0036* (2013.01); *H01L 51/0077* (2013.01); *H01L 51/4213* (2013.01); *H01L 51/442* (2013.01); *H01L 51/4226* (2013.01)

(58) Field of Classification Search
CPC ............. H01L 51/4253; H01L 51/4273; H01L 51/442; H01L 51/0034–51/0047; H01L 31/0264; H01L 2031/0344
See application file for complete search history.

(56) References Cited

U.S. PATENT DOCUMENTS

| | | | | |
|---|---|---|---|---|
| 2016/0111223 | A1* | 4/2016 | Bryant | H01L 51/0024 136/256 |
| 2016/0133672 | A1* | 5/2016 | Koposov | H01L 27/302 136/255 |
| 2016/0268510 | A1* | 9/2016 | Moon | H01L 51/424 |
| 2016/0351841 | A1* | 12/2016 | Suzuka | H01L 51/4226 |
| 2017/0213967 | A1* | 7/2017 | Chen | H01L 51/006 |
| 2017/0338045 | A1* | 11/2017 | Vak | H01G 9/0029 |
| 2017/0358757 | A1* | 12/2017 | Lee | C01G 21/16 |
| 2017/0365418 | A1* | 12/2017 | Schumann | H01G 9/2059 |
| 2018/0006241 | A1* | 1/2018 | Ahmad | H01L 51/0072 |
| 2018/0040840 | A1* | 2/2018 | Hayakawa | H01L 51/442 |
| 2018/0040841 | A1* | 2/2018 | Asano | H01L 51/4253 |

OTHER PUBLICATIONS

Li et al.; "Laminated Carbon Nanotube Networks for Metal Electrode-Free Efficient Perovskite Solar Cells"; ACS Nano; Jun. 16, 2014; 28 pp.; vol. 8; 6797-6804; ACS Publications, American Chem. Society; Washington D.C.

Della Gaspera et al.; "Ultra-thin high efficiency semitransparent perovskite solar cells"; Nano Engergy; Feb. 26, 2015; 9 pp.; vol. 13; 249-257; Elsevier Ltd.; Amsterdam, NL.

Bu et al.; "Semi-transparent fully-air processed perovskite solar cells"; ACS Applied Materials & Interfaces; 2015; 22 pp.; vol. 7, 17776-17781; Wuhan National Laboratory for Optoelectronics, Huazhong University of Science and Technology; Wuhan, China.

* cited by examiner

METHOD FOR PREPARING A BONDED TYPE PEROVSKITE SOLAR CELL

CROSS-REFERENCE TO RELATED APPLICATION

This application claims under 35 U.S.C. § 119(a) the benefit of Korean Patent Application No. 10-2016-0145867, filed on Nov. 3, 2016, the entire contents of which are incorporated herein by reference.

BACKGROUND

(a) Technical Field

The present disclosure relates to a method for preparing a perovskite solar cell by a non-deposition method.

(b) Background Art

Recently, as regulation for carbon dioxide emissions has been reinforced and an interest in fuel efficiency of vehicles is increased, the environment-friendly vehicle market has been expanded. In addition, due to an increase in components mounted on the vehicle, the power consumption of the vehicle is gradually rising.

As a method for supplying additional power to the vehicle, a method of supplying the power by using a battery having a larger capacity or producing self-power from the frame of the vehicle may be considered. However, in the case of using a large-capacity battery, the weight of the vehicle body itself is increased, and thus fuel efficiency may be decreased.

Accordingly, an interest in a vehicle integrated photovoltaics (hereinafter, referred to as 'VIPV') capable of supplying the power to the vehicle while satisfying eco-friendly and high fuel efficiency has been increased.

The VIPV may be mounted on both a transparent part such as a sunroof and a window and an opaque part such as a vehicle body, but recently, since the sunroof mounting rate of the vehicle is rapidly increased, many attempts to apply the VIPV to the sunroof have been made.

As a solar cell that may be used as the VIPV, a crystalline silicon solar cell, an amorphous silicon solar cell, a compound thin film solar cell, a dye-sensitized solar cell, an organic solar cell, a perovskite solar cell, and the like are included. Among them, a perovskite solar cell having high transparency due to a thin film, and excellent efficiency is considered as the most influential candidate.

The Snaith group (Snaith et al., ACS Nano 8, 591, 2014) prepared a semi-transmission type perovskite solar cell by placing a hole conductor on an island-shaped perovskite thin film and depositing a thin gold electrode thereon, the Mhaisalkar group (Mhaisalkar et al., ACS Nano 8, 6797, 2014) prepared a semi-transmission type perovskite solar cell by coating a perovskite light absorbing layer on porous titanium dioxide and then depositing a carbon nanotube (CNT) film electrode or a CNT/hole conductor complex film electrode, and the Cheng group (Cheng et al, Nano Energy 13, 249, 2015) prepared a semi-transmission flat type perovskite solar cell by coating a perovskite light absorbing layer on flat titanium dioxide and then depositing molybdenum trioxide ($MoO_3$)/gold (Au)/molybdenum trioxide ($MoO_3$).

However, these methods are preparing methods for the perovskite solar cell by a deposition method, particularly, a vacuum deposition method and have a limitation that processing costs are too high.

Accordingly, the Zhou group (Zhou et al., ACS Applied Materials & Interface 7, 17776, 2015) prepared a porous perovskite solar cell by coating a perovskite light absorbing layer on porous titanium dioxide, forming a hole conductor by spin-coating, and then transferring a PEDOT:PSS conductive polymer film. That is, a conductive polymer electrode is formed on the hole conductor by a transfer method instead of the deposition method. However, the method also uses a hydrophilic conductive polymer and has a limitation that a perovskite layer vulnerable to water is easily decomposed and thus the durability is deteriorated.

The above information disclosed in this Background section is only for enhancement of understanding of the background and therefore it may contain information that does not form the prior art that is already known in this country to a person of ordinary skill in the art.

SUMMARY OF THE DISCLOSURE

The present disclosure has been made in an effort to solve the above-described problems associated with prior art.

An object of the present disclosure is to provide a preparing method for a perovskite solar cell by a non-deposition method.

Another object of the present disclosure is to provide a preparing method for a bonded type perovskite solar cell capable of significantly enhancing bonding yield.

The objects of the present disclosure are not limited to the objects described above. The objects of the present disclosure will be more apparent in the description below and implemented by means described in the claims and a combination thereof.

The present disclosure includes the following configurations in order to achieve the above objects.

In one aspect, a preparing method is provided for a bonded type perovskite solar cell including: 1) laminating an electron transport layer, a light absorption layer, and a first hole transport layer on a transparent electrode by a non-deposition process to provide a first substrate; (2) forming a second hole transport layer on an opposing electrode by a non-deposition process to provide a second substrate; and (3) bonding the first substrate and the second substrate while contacting the first hole transport layer and the second hole transport layer.

In an embodiment, the light absorbing layer may be formed of a compound having a perovskite structure satisfying the following Chemical Formula: $AMX_3$, wherein: A may be a monovalent cationic metal ion, a monovalent organic ammonium ion, or a mixture thereof; M may be a divalent metal ion; and X may be a halogen ion.

In another embodiment, the first hole transport layer may be formed by coating a solution including a hole conductor and a first solvent on the light absorbing layer, and the second hole transport layer may be formed by coating a solution including a hole conductor and a second solvent on the opposing electrode.

In still another embodiment, the bonding act may be performed while the first hole transport layer is in a semi-dried state.

In yet another embodiment, the first solvent may satisfy at least one of the following conditions (a) to (c): (a) a boiling point of the first solvent is higher than a boiling point of the second solvent; (b) vapor pressure of the first solvent is lower than vapor pressure of the second solvent; and (c) volatility of the first solvent is lower than volatility of the second solvent.

In still yet another embodiment, the second solvent may be at least one of toluene, benzene and methylethyl ketone, and the first solvent may be at least one of dichlorobenzene, chlorobenzene and xylene.

In a further embodiment, the bonding act may be performed while the second hole transport layer is in a semi-dried state.

In another further embodiment, the second solvent may satisfy at least one of the following conditions (a) to (c): (a) a boiling point of the second solvent is higher than a boiling point of the first solvent; (b) vapor pressure of the second solvent is lower than vapor pressure of the first solvent; and (c) volatility of the second solvent is lower than volatility of the first solvent.

In still another further embodiment, the first solvent may be at least one of toluene, benzene and methylethyl ketone, and the second solvent may be at least one of dichlorobenzene, chlorobenzene and xylene.

In yet another further embodiment, the hole conductor may be at least one selected from a group consisting of
spiro-MeOTAD(2,2',7'-tetrakis-(N, N-di-p-methoxyphenyl-amine)-9,9'spirobifluorene),
P3HT(poly[3-hexylthiophene]),
MDMO-PPV(poly[2-methoxy-5-(3',7-dimethyloctyloxyl)]-1,4-phenylene vinylene),
MEH-PPV(poly[2-methoxy-5-(2"-ethylhexyloxy)-p-phenylene vinylene]),
P3OT(poly(3-octylthiophene)), P3DT(poly(3-decylthiophene)),
P3DDT(poly(3-dodecylthiophene)), PPV(poly(p-phenylene vinylene)),
TFB(poly(9,9'-dioctyfluorene-co-N-(4-butylphenyl)diphenylamine)), PCPDTBT(poly[2,1,3-benzothiadiazole-4,7-diyl[4,4-bis(2-ethylhexyl-4H-cydopenta[2,1-b:3,4-b']dithiophene-2,6-diyl)]]),
Si-PCPDTBT(poly[(4,4'-bis(2-ethylhexyl)dithieno[3,2-b:2',3'-d]silole)-2,6-diyl-alt-(2,1,3-benzothiadiazole)-4,7-diyl]),
PBDTTPD(poly((4,8-diethylhexyoxylxy)benzo([1,2-b:4,5-b']dithiophene)-2,6-diyl)-alt-((5-octylthieno[3,4-c]pyrrole-4,6-dione)-1,3-diyl)),
PFDTBT(poly[2,7-(9-(2-ethylhexyl)-9-hexyl-fluorene)-alt-5,5-(4',7-di-2-thienyl-2',1',3'-benzothiadiazole)]),
PFO-DBT(poly[2,7-9,9-(dioctyl-fluorene)-alt-5,5-(4',7'-di-2-thienyl-2',1',3'-benzothiadiazoie)]),
PSiFDTBT(poly[(2,7-dioctylsilafluorene)-2,7-diyl-alt-(4,7-bis(2-thienyl)-2,1,3-benzothiadiazole)-5,5'-diyl]),
PSBTBT(poly[(4,4'-bis(2-ethylhexyl)dithieno[3,2-b:2',3'-d]silole)-2,6-diyl-alt-(2,1,3-benzothiadiazole)-4,7-diyl]), PCDTBT(poly[[9-(1-otynonyl)-9H-carbazole-2,7-diyl]-2,5-thiophenediyl-2,1,3-benzothiadiazole-4,7-diyl-2,5-thiophenediyl]),
PFB(poly(9,9'-dioctylfluorene-co-bis(N,N'-(4,butylphenyl))bis(N,N-phenyl-1,4-phenylene)diamine), F8BT(poly(9, 9'-dioctylfluorene-co-benzothiadiazole), PEDOT (poly(3, 4-ethylenedioxythiophene)), PEDOT:PSS (poly(3,4-ethylenedioxythiophene):poly(styrenesulfonate)), PTAA (poly(triarylamine)), poly(4-butylphenyl-diphenyl-amine), and copolymers thereof.

In still yet another further embodiment, in the bonding act, the first substrate and the second substrate may be laminated and then dried under conditions of 10° C. to 60° C. and 10 hrs to 30 hrs in a pressurized state.

In a still further embodiment, the transparent electrode may be formed by coating at least one of indium tin oxide (ITO), fluorine tin oxide (FTO), aluminum doped zinc oxide (AZO), indium zinc oxide (IZO), ZnO—Ga$_2$O$_3$, ZnO—Al$_2$O$_3$, or antimony tin oxide (ATO) on a transparent substrate.

In a yet still further embodiment, the opposing electrode may be formed by coating at least one of indium tin oxide (ITO), fluorine tin oxide (FTO), aluminum doped zinc oxide (AZO), indium zinc oxide (IZO), ZnO—Ga$_2$O$_3$, ZnO—Al$_2$O$_3$, or antimony tin oxide (ATO) on the transparent substrate; or a metal electrode made of at least one metal of silver (Ag), aluminum (Al), platinum (Pt), tungsten (W), copper (Cu), molybdenum (Mo), gold (Au), nickel (Ni), or palladium (Pd).

In a yet still further embodiment, the electron transport layer may be a blocking electron transport layer in which at least one of TiO$_2$, SnO$_2$, ZnO, WO$_3$, Nb$_2$O$_5$, or TiSrO$_3$ is formed on the transparent electrode in a thin film form.

In a yet still further embodiment, the electron transport layer may further include a porous electron transport layer formed by coating a paste including at least one of TiO$_2$, SnO$_2$, ZnO, WO$_3$, Nb$_2$O$_5$, or TiSrO$_3$ on the blocking electron transport layer.

The present disclosure includes the above configurations and thus has the following effects.

Since the present disclosure is a non-deposition preparing method for a perovskite solar cell without using expensive equipment, processing costs may be significantly lowered. Accordingly, price competitiveness in the market may be greatly enhanced.

Since a first hole transport layer or a second hole transport layer function as a bonding medium, a perovskite solar cell having excellent durability due to very good bonding yield can be prepared without a deposition process.

The effects of the present disclosure are not limited to the aforementioned effects. It should be understood that the effects of the present disclosure include all effects inferable from the description below.

Other aspects and embodiments of the disclosure are discussed below.

It is understood that the term "vehicle" or "vehicular" or other similar term as used herein is inclusive of motor vehicles such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

The above and other features of the disclosure are discussed below.

BRIEF DESCRIPTION OF THE DRAWINGS

The above and other features of the present disclosure will now be described in detail with reference to certain exemplary embodiments thereof illustrated in the accompanying drawings which are given hereinbelow by way of illustration only, and thus are not limitative of the present disclosure, and wherein.

Figure 1:
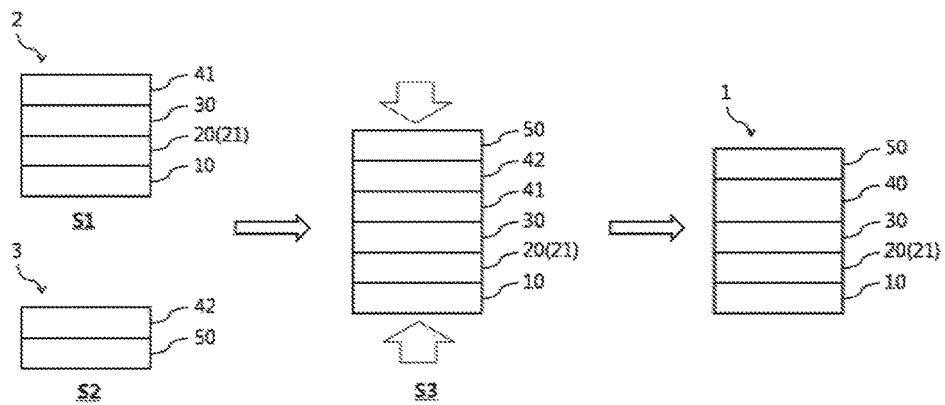
FIG. 1 illustrates an embodiment of a preparing method for a bonded type perovskite solar cell.

Reference numerals set forth in the Drawings includes reference to the following elements as further discussed below, wherein 1 refers a bonded type perovskite solar cell; 2 refers to a first substrate; 3 refers to a second substrate; 10 refers to a transparent electrode; 20 refers to a electron transport layer; 21 refers to a blocking electron transport layer; 22 refers to a porous electron transport layer; 30 refers to a light absorbing layer, 40 refers to a hole transport layer, 41 refers to a first hole transport layer; 42 refers to a second hold transport layer; and 50 refers to a opposing electrode.

The appended drawings are not necessarily to scale, presenting a somewhat simplified representation of various features illustrative of the basic principles of the disclosure. The specific design features as disclosed herein, including, for example, specific dimensions, orientations, locations, and shapes will be determined in part by the intended application and use environment.

In the figures, reference numbers refer to the same or equivalent parts throughout the several figures of the drawing.

DETAILED DESCRIPTION

Hereinafter reference will now be made in detail to various embodiments, examples of which are illustrated in the accompanying drawings and described below. While the disclosure will be described in conjunction with exemplary embodiments, it will be understood that present description is not intended to limit the disclosure to those exemplary embodiments. On the contrary, the disclosure is intended to cover not only the exemplary embodiments, but also various alternatives, modifications, equivalents and other embodiments, which may be included within the spirit and scope of the disclosure as defined by the appended claims.

Hereinafter, the present disclosure will be described in more detail through exemplary embodiments. The exemplary embodiments may be modified in various forms as long as the gist is not changed. However, the scope of the present disclosure is not limited to the following exemplary embodiments.

When it is determined that the description for the known configurations and functions may obscure the gist, the description for the known configurations and functions will be omitted. In this specification, the term "comprise" means that other constituent elements may be further included unless otherwise listed.

Hereinafter, various embodiments of a preparing method for a bonded type perovskite solar cell will be described in detail.

FIG. 1 illustrates an embodiment. Referring to FIG. 1, a preparing method for a bonded type perovskite solar cell 1 may include (1) a first substrate forming act (S1) of laminating and forming an electron transport layer 20, a light absorption layer 30, and a first hole transport layer 41 on a transparent electrode 10 by a non-deposition process, (2) a second substrate forming act (S2) of forming a second hole transport layer 42 on an opposing electrode 50 by a non-deposition process, and (3) bonding the first substrate 2 and the second substrate 3 to contact the first hole transport layer 41 and the second hole transport layer 42.

The forming by the "non-deposition process" has the following meaning. The term "deposition" may refer to a small piece of metal or salt that is electrically heated in a high-vacuum container, melted, and evaporated, and the stream adheres onto the surface of an object as a thin film. As a result, the non-deposition process means a method of applying a raw material on the surface of another object or coating the raw material in a film form by a method such as sputtering, spin coating, spraying, screen printing, inkjet printing, doctor blading or gravure printing.

The first substrate forming act (S1) is an act of forming the electron transport layer 20, the light absorption layer 30, and the first hole transport layer 41 on the transparent electrode 10.

The transparent electrode 10 may be formed by coating at least one of indium tin oxide (ITO), fluorine tin oxide (FTO), aluminum doped zinc oxide (AZO), indium zinc oxide (IZO), $ZnO$—$Ga_2O_3$, $ZnO$—$Al_2O_3$ and antimony tin oxide (ATO) on a transparent substrate.

The transparent substrate may be glass; or a flexible transparent resin such as polyethylene terephthalate, polyethylene naphthalate, polycarbonate, polypropylene, polyimide, or triacetyl cellulose. The electron transport layer 20 may be a blocking electron transport layer 21 in which at least one of $TiO_2$, $SnO_2$, ZnO, $WO_3$, $Nb_2O_5$, or $TiSrO_3$ is formed on the transparent electrode in a thin film form.

The blocking electron transport layer 21 is a configuration of receiving electrons generated when light absorbing molecules in the light absorbing layer are excited by sunlight to transport the electrons to the transparent electrode and may be formed in a kind of thin film form to prevent the electrons from being recombined with the first hole transport layer by blocking the transparent electrode and the first hole transport layer from directly contacting each other. Accordingly, the blocking electron transport layer may improve a bonding property of the transparent electrode and the light absorbing layer.

The blocking electron transport layer 21 may be formed on the transparent electrode by the aforementioned non-deposition method and, for example, formed by spraying a solution including a precursor material such as $TiO_2$, $SnO_2$, ZnO, $WO_3$, $Nb_2O_5$, or $TiSrO_3$ on the transparent electrode. However, the method of forming the blocking electron transport layer is not limited thereto.

The light absorption layer 30 may be formed by applying or coating a compound having a perovskite structure as light absorbing molecules on the electron transport layer.

When the sunlight is incident to the light absorption layer 30, the light absorbing molecules are electron-transited from a ground state to an excited state to generate an electron-hole pair. The electrons are transported to the transparent electrode through the electron transport layer and then move to an opposing electrode facing the transparent electrode through an external circuit. Meanwhile, the electron-transited (e.g., oxidized) light absorbing molecules are reduced by oxidation-reduction coupled ions in the first hole transport layer and the oxidized oxidation-reduction coupled ions cause a reduction reaction with the electrons reaching the opposing electrode to form charge neutralization and thus the perovskite solar cell is operated.

The compound having the perovskite structure may be a compound satisfying the following Chemical Formula: $AMX_3$, wherein A is a monovalent cationic metal ion, a monovalent organic ammonium ion, or a mixture thereof; M is a divalent metal ion, and X is a halogen ion.

Particularly, the compound having the perovskite structure may be at least one compound of $CH_3NH_3PbI_3$, $CH_3NH_3PbBr_3$, $CH_3NH_3PbCl_3$, $NH_2CH_2NH_2PbI_3$, $NH_2CH_2NH_2PbBr_3$, $NH_2CH_2NH_2PbCl_3$, $CsPbI_3$, $CsPbBr_3$, or $CsPbC_3$.

The light absorption layer 30 may be formed on the electron transport layer by the aforementioned non-deposition method and, for example, formed by spin-coating a solution including the compound having the perovskite structure on the electron transport layer. However, the method of forming the light absorption layer is not limited thereto.

The first hole transport layer 41 may be formed by applying or coating a solution including a hole conductor, a first solvent, a lithium salt, and an additive on the light absorption layer.

The first hole transport layer 41 is a configuration of transporting holes generated from the light absorption layer to the opposing electrode and simultaneously functions as a bonding medium of the first substrate and the second substrate.

In order to use the first hole transport layer 41 as the bonding medium, the first hole transport layer may be formed in a semi-dried state. The "semi-dried state" may refer to a sticky state in which a liquid component is partially removed from the first hole transport layer formed by applying the solution including the hole conductor, the first solvent, the lithium salt, and the additive. The semi-dried state can be understood by those of ordinary skill in the art.

By forming the first hole transport layer 41 in the semi-dried state, as described below, when the first substrate and the second substrate are bonded with each other by pressurizing and drying, the remaining first solvent of the first hole transport layer dissolves the surface of the second hole transport layer of the second substrate, and finally, the first hole transport layer and the second hole transport layer may form one uniform or equal phase.

In order to form the first hole transport layer 41 in the semi-dried state, the solution including the hole conductor, the first solvent, the lithium salt, and the additive may be spin-coated on the light absorbing layer under conditions of 2,000 RPM to 4,000 RPM and 5 to 30 seconds. However, the present disclosure is not limited thereto and the first hole transport layer may be formed by any method so long as the first hole transport layer may be formed in the semi-dried state enough to be used as the bonding medium.

The hole conductor may be at least one selected from a group consisting of
spiro-MeOTAD(2,2',7,7'-tetrakis-(N, N-di-p-methoxyphenyl-amine)-9,9'spirobifluorene), P3HT(poly[3-hexylthiophene]),
MDMO-PPV(poly[2-methoxy-5-(3',7'-dimethyloctyloxyl)]-1,4-phenylene vinylene),
MEH-PPV(poly[2-methoxy-5-(2"-ethylhexyloxy)-p-phenylene vinylene]),
P3OT(poly(3-octylthiophene)), P3DT(poly(3-decylthiophene)),
P300T(poly(3-dodecylthiophene)), PPV(poly(p-Phenylene vinylene)),
TFB(poly(9,9'-dioctylfluorene-co-N-(4-butylphenyl)diphenylamine)),
PCPDTBT(poly[2,1,3-benzothiadiazole-4,7-diyl[4,4-bis(2-ethylhexyl-4H-cyclopenta[2,1-b:3,4-b']dithiophene-2,6-diyl)]]),
Si-PCPDTBT(poly[(4,4'-bis(2-ethylhexyl)dithieno[3,2-b:2',3'-d]silole)-2,6-diyl-alt-(2,1,3-benzothiadiazole)-4,7-diyl]),
PBDTTPD(poly((4,8 diethylhexyloxyl)benzo([1,2-b:4,5-b']dithiophene)-2,6-diyl)-alt-((5-octylthieno[3,4-c]pyrrole-4,6-dione)-1,3-diyl)),
PFDTBT(poly[2,7-(9-(2-ethylhexyl)-9-hexyl-fluorene)-alt-5,5-(4',7,-di-2-thienyl-2',1',3'-benzothiadiazole)]),
PFO-DBT(poly[2,7-9,9-(dioctyl-fluorene)-alt-5,5-(4',7'-di-2-thienyl-2',1',3'-benzothiadiazole)]),
PSiFDTBT(poly[(2,7-dioctylsilafluorene)-2,7-diyl-alt-(4,7-bis(2-thienyl)-2,1,3-benzothiadiazole)-5,5'-diyl]),
PSBTBT(poly[(4,4-bis(2-ethylhexyl)dithieno[3,2-b:2',3'-d]silole)-2,6-diyl-alt-(2,1,3-benzothiadiazole)-4,7-diyl]),
PCDTBT(poly[[9-(1-octytnonyl)-9H-carbazole-2,7-diyl]-2,5-thiophenediyl-2,1,3-benzothiadiazole-4,7-diyl-2,5-thiophenediyl]),
PFB(poly(9,9'-dioctylfluorene-co-bis(N,N'(4,butylphenyl)) bis(N,N'-phenyl-1,4-phenyl ene)diamine), F8BT(poly(9,9'-dioctylfluorene-co-benzothiadiazole), PEDOT (poly(3,4-ethylenedioxythiophene)), PEDOT:PSS (poly(3,4-ethylenedioxythiophene):poly(styrenesulfonate)), PTAA (poly(triarylamine)), poly(4-butylphenyl-diphenyl-amine), and copolymers thereof.

The first solvent may be at least one of dichlorobenzene, chlorobenzene, or xylene. The detailed description thereof will be described below.

The lithium salt may be Li-bis(trifluoromethanesulfonyl) imide (Li-TFSI) and the like.

The additive may be urea, thiourea, t-butylpyridine, guanidine thiocyanate, or the like.

The second substrate forming act (S2) is an act of forming the second hole transport layer 42 on the opposing electrode 50.

In the case of preparing a transparent perovskite solar cell or a translucent perovskite solar cell, the opposing electrode 50 may be formed by coating at least one of indium tin oxide (ITO), fluorine tin oxide (FTO), aluminum doped zinc oxide (AZO), indium zinc oxide (IZO), $ZnO-Ga_2O_3$, $ZnO-Al_2O_3$, or antimony tin oxide (ATO) on the transparent substrate like the transparent electrode.

Meanwhile, in the case of preparing an opaque perovskite solar cell, the opposing electrode 50 may use a metal electrode made of at least one metal of silver (Ag), aluminum (Al), platinum (Pt), tungsten (W), copper (Cu), molybdenum (Mo), gold (Au), nickel (Ni), or palladium (Pd).

The second hole transport layer 42 may be formed by applying or coating a solution including a hole conductor, a second solvent, a lithium salt, and an additive on the opposing electrode.

The second hole transport layer 42 is integrated with the first hole conductive layer to transport holes generated from the light absorbing layer to the opposing electrode. However, in an embodiment, the second hole transport layer is not used as the bonding medium of the first substrate and the second substrate unlike the first hole transport layer.

The hole conductor, the lithium salt, and the additive have been described and will be omitted to avoid the duplication.

The second solvent may be at least one of toluene, benzene, or methylethyl ketone. The detailed description thereof will be described below.

The second hole transport layer 42 may be formed on the opposing electrode by the non-deposition method described above, and, for example, may be formed by spin-coating a solution including the hole conductor, the second solvent, the lithium salt and the additive on the opposing electrode. However, the method of forming the second hole transport layer is not limited thereto.

The first substrate forming act (S1) and the second substrate forming act (S2) may be sequentially performed or discontinuously performed, and, for example, while only the electron transport layer and the light absorbing layer are formed on the transparent electrode in the first substrate forming act, the second substrate forming act is performed, and the first hole transport layer is formed on the light absorbing layer again, and then the bonding act (3) may be performed.

The bonding act (3) is an act of bonding the first substrate 2 and the second substrate 3 by using the first hole transport layer 41 as a bonding medium. Accordingly, as illustrated in FIG. 1, the first substrate 2 and the second substrate 3 are bonded to each other by laminating the first hole transport layer 41 and the second hole transport layer 42 to contact each other, and then pressurizing and drying the first hole transport layer 41 and the second hole transport layer 42.

The bonding act (3) is performed while the first hole transport layer 41 is in the semi-dried state, and the first hole transport layer 41 functions as a kind of bonding agent to be attached to the second hole transport layer 42 and pressurized and dried in this state, and thus the bonded type perovskite solar cell 1 has excellent bonding yield.

In the pressurizing and drying process of the bonding act (3), the first solvent of the first hole transport layer 41 is rapidly evaporated and thus volume contraction occurs. As a result, in order to prevent the bonding yield of the first substrate 2 and the second substrate 3 from being deteriorated, the first solvent uses a solvent having a high boiling point, low vapor pressure, or low volatility.

Particularly, the first solvent may be a solvent having a high boiling point, low vapor pressure, or low volatility compared with the second solvent. Since both the first hole transport layer and the second hole transport layer are formed in a completely dried state if the first solvent does not satisfy the above conditions, in the bonding act (3), the first hole transport layer and the second hole transport layer may not be formed in a uniform or equal phase. The first solvent may use at least one of dichlorobenzene, chlorobenzene and xylene and the second solvent may use at least one of toluene, benzene, or methylethyl ketone.

The bonding act (3) may be performed by laminating the first substrate and the second substrate and drying the first substrate and the second substrate under conditions of 10° C. to 60° C. and 10 hrs to 30 hrs in a pressurized state.

As a result, the bonded type perovskite solar cell 1 prepared by the method illustrated in FIG. 1 has a laminated structure of the transparent electrode 10, the electron transport layer 20, the light absorbing layer 30, the hole transport layer 40, and the opposing electrode 50.

Figure 2:
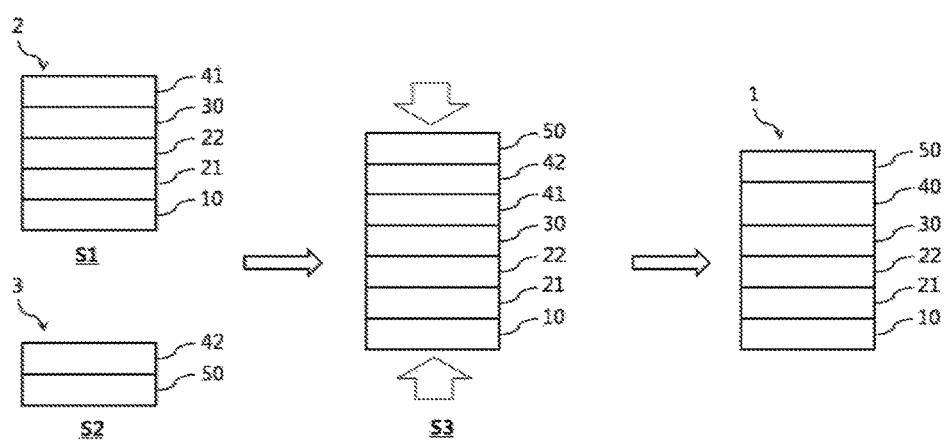
FIG. 2 illustrates another embodiment of a preparing method for a bonded type perovskite solar cell.

FIG. 2 illustrates another embodiment. The embodiment illustrated in FIG. 2 is different from the embodiment illustrated in FIG. 1 in that a porous electron transport layer 22 in addition to the blocking electron transport layer 21 is formed as the electron transport layer 20. Hereinafter, another embodiment will be described in detail. However, other configurations and methods except for the above difference are the same and thus will be omitted to avoid the duplicated description.

Referring to FIG. 2, another embodiment may further include forming a porous electron transport layer 22 on the blocking electron transport layer 21 after forming the blocking electron transport layer 21 by the aforementioned configuration and method in the first substrate forming act (S1).

The porous electron transport layer 22 has a similar function to the blocking electron transport layer and simultaneously a configuration to allow more light to be absorbed in the light absorbing layer because a part of the light absorbing layer is absorbed into the inside having a large specific surface area of the porous electron transport layer.

The porous electron transport layer 22 may be formed on the blocking electron transport layer by a non-deposition method and for example, formed by spin-coating a paste including at least one of $TiO_2$, $SnO_2$, ZnO, $WO_3$, $Nb_2O_5$, or $TiSrO_3$ on the blocking electron transport layer. However, the method of forming the porous electron transport layer is not limited thereto.

As a result, the bonded type perovskite solar cell 1 prepared by the method illustrated in FIG. 2 has a laminated structure of the transparent electrode 10, the blocking electron transport layer 21, the porous electron transport layer 22, the light absorbing layer 30, the hole transport layer 40, and the opposing electrode 50.

Figure 3:
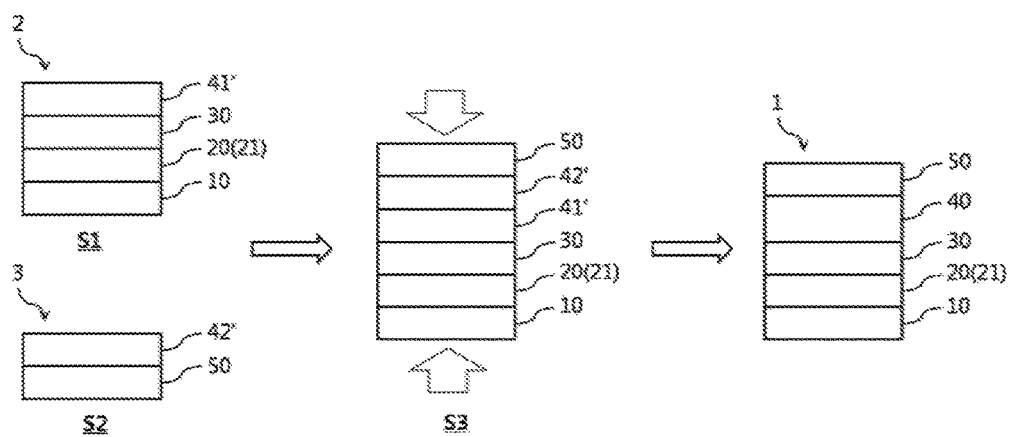
FIG. 3 illustrates yet another embodiment of a preparing method for a bonded type perovskite solar cell.

FIG. 3 illustrates yet another embodiment. The embodiment illustrated in FIG. 3 is different from the embodiment illustrated in FIG. 1 in that a bonding medium of the first substrate 2 and the second substrate 3 is a second hole transport layer 42'.

Accordingly, in the second substrate forming act (S2), the second hole transport layer 42' is formed in a semi-dried state. To this end, the second hole transport layer may be formed by spin-coating a solution including a hole conductor, a second solvent, a lithium salt, and an additive on the opposing electrode under conditions of 2,000 RPM to 4,000 RPM and 5 seconds to 30 seconds. However, the present disclosure is not limited thereto and the second hole transport layer may be formed by any method so long as the second hole transport layer may be formed in the semi-dried state enough to be used as the bonding medium.

In the pressurizing and drying process of the bonding act (3), the second solvent of the second hole transport layer is rapidly evaporated and thus volume contraction occurs. As a result, in order to prevent the bonding yield of the first substrate 2 and the second substrate 3 from being deteriorated, the second solvent uses a solvent having a high boiling point, low vapor pressure, or low volatility.

Particularly, the second solvent may be a solvent having a high boiling point, low vapor pressure, or low volatility compared with the first solvent. The second solvent may use at least one of dichlorobenzene, chlorobenzene, or xylene and the first solvent may use at least one of toluene, benzene, or methylethyl ketone.

Since other configurations and methods are the same as those of the embodiment illustrated in FIG. 1, the other configurations and methods will be hereinafter omitted to avoid the duplicated description.

As a result, the bonded type perovskite solar cell 1 prepared by the method illustrated in FIG. 3 has a laminated structure of the transparent electrode 10, the electron transport layer 20, the light absorbing layer 30, the hole transport layer 40, and the opposing electrode 50.

Hereinafter, detailed Examples are provided. However, the following Examples are to exemplify or describe the present disclosure in detail and the present disclosure is not limited.

EXAMPLES

The following examples illustrate the disclosure and are not intended to limit the same.

Example 1

(1) Forming of First Substrate

1) Preparing transparent electrode: Fluorine tin oxide (FTO, TEC8) doped with fluorine was cut with 2.5 cm×2.5 cm and the FTO was partially removed by etching an end part.

2) Forming electron transport layer (blocking electron transport layer): A titanium acetylacetonateethanol (a volume ratio of 1/9) solution was sprayed on a transparent electrode heated at 450° C. several times to form a titanium dioxide thin film with a thickness of about 50 nm.

3) Forming light absorbing layer: 10 volume % of a HI aqueous solution was put in 40 wt % of a $CH_3NH_3PbI_3$ (perovskite)/dimethyl formamide solution and then the solution was dropped on the electron transport layer and spin-coated at about 3,000 RPM for 200 seconds to form a light absorbing layer.

4) Forming first hole transport layer. A solution including poly-3-hexythiophene (P3HT) as a hole conductor, dichlorobenzene as a first solvent, Li-bis(trifluoromethanesulfonyl)imide (Li-TFSI) as a lithium salt, and t-butylpyridine as an additive was dropped on the light absorbing layer and spin-coated at about 3,000 RPM for 10 seconds to form a first hole transport layer in a semi-dried state.

(2) Forming of Second Substrate

1) Preparing opposing electrode: Indium tin oxide (ITO) with a size of 2.5 cm×2.5 cm was prepared.

2) Forming second hole transport layer: A solution including poly-3-hexythiophene (P3HT) as a hole conductor, toluene as a second solvent, Li-bis(trifluoromethanesulfonyl) imide (Li-TFSI) as a lithium salt, and t-butylpyridine as an additive was dropped on the opposing electrode and spin-coated at about 3,000 RPM for 60 seconds to form a second hole transport layer.

(3) Bonding Act

While the first hole transport layer was in the semi-dried state, the first hole transport layer and the second hole transport layer contacted each other and then were dried for 18 hrs in an oven at 60° C. while being pressurized at predetermined pressure to bond the first substrate and the second substrate by slowly evaporating the solvent.

Example 2

Except for forming the porous electron transport layer below after forming the blocking electron transport layer in the first substrate forming act in Example 1, the bonded type perovskite solar cell was prepared by the same method as Example 1.

Forming porous electron transport layer: A titanium dioxide paste (diSol: 18NR-T) diluted at a level of 20 nm was spin-coated on the blocking electron transport layer to form a porous electron transport layer with a thickness of about 200 nm. Thereafter, strength of the porous electron transport layer was enhanced by heating at 500° C. for 1 hr. Further, the first substrate (the porous electron transport layer/the blocking electron transport layer/the transparent electrode) was deposited in 20 mM of a tetrachloro-titanium dioxide aqueous solution at 60° C. for about 1 hr, washed with deionized water and ethanol and dried, and heated again at 500° C. for 30 minutes.

Example 3

Unlike Example 1, a bonded type perovskite solar cell was prepared by using the second hole transport layer as a bonding medium of the first substrate and the second substrate. A difference from Example 1 was as follows and otherwise, the bonded type perovskite solar cell was prepared by the same method as Example 1.

Forming first hole transport layer: A solution including poly-3-hexylthiophene (P3HT) as a hole conductor, toluene as a first solvent, Li-bis(trifluoromethanesulfonyl)imide (Li-TFSI) as a lithium salt, and t-butylpyridine as an additive was dropped on the light absorbing layer and spin-coated at about 3,000 RPM for 60 seconds to form a first hole transport layer.

Forming second hole transport layer A solution including poly-3-hexylthiophene (P3HT) as a hole conductor, dichlorobenzene as a second solvent, Li-bis(trifluoromethanesulfonyl)imide (Li-TFSI) as a lithium salt, and t-butylpyridine as an additive was dropped on the opposing electrode and spin-coated at about 3,000 RPM for 10 seconds to form a second hole transport layer in a semi-dried state.

Example 4

Except for forming the porous electron transport layer by the same method as Example 2, after forming the blocking electron transport layer in the first substrate forming act in Example 3, the bonded type perovskite solar cell was prepared by the same method as Example 3.

Example 5

Except for using chlorobenzene instead of dichlorobenzene when forming the first hole transport layer in Example 1, the bonded type perovskite solar cell was prepared by the same method as Example 1.

Example 6

Except for slowly evaporating the solvent by drying at room temperature (25° C.) for 28 hrs in the bonding act (3) in Example 1, the bonded type perovskite solar cell was prepared by the same method as Example 1.

Example 7

Except for using a copper plate instead of ITO as the opposing electrode in Example 1, the bonded type perovskite solar cell was prepared by the same method as Example 1.

Example 8

Except for using polytriarylamine (PTAA) as the hole conductor in Example 1, the bonded type perovskite solar cell was prepared by the same method as Example 1.

Comparative Example 1

Like Example 1, the perovskite solar cell was prepared by sequentially laminating respective components instead of forming and then bonding the first substrate and the second substrate.

1) Preparing transparent electrode: same as Example 1
2) Forming electron transport layer (blocking electron transport layer): same as Example 1
3) Forming light absorbing layer same as Example 1
4) Forming hole transport layer and bonding opposing electrode: A solution including poly-3-hexylthiophene (P3HT) as a hole conductor, toluene as a solvent, Li-bis (trifluoromethanesulfonyl)imide (Li-TFSI) as a lithium salt, and t-butylpyridine as an additive was dropped on the light absorbing layer and spin-coated at about 3,000 RPM for 10 seconds to form a hole transport layer.

Indium tin oxide (ITO) having a size of 2.5 cm×2.5 cm was covered on the hole transport layer and then dried for 18 hrs in an oven at 60° C. while being pressurized at predetermined pressure to slowly evaporate the solvent and then the perovskite solar cell was prepared.

Comparative Example 2

Except for forming the porous electron transport layer by the same method as Example 2, after forming the blocking electron transport layer in Comparative Example 1, a perovskite solar cell was prepared by the same method as Comparative Example 1.

TEST EXAMPLES

When one corner of the transparent electrode of each of the perovskite solar cells in Examples 1 to 9 and Comparative Examples 1 to 3 was picked up, bonding yield was evaluated based on whether the first substrate and the second substrate were not separated from each other, but the bonding state was maintained. The result is illustrated in Tables 1 and 2 below.

TABLE 1

| Classification | Example 1 | Example 2 | Example 3 | Example 4 | Example 5 |
|---|---|---|---|---|---|
| Bonding yield | 20/20 | 20/20 | 19/20 | 19/20 | 19/20 |

TABLE 2

| Classification | Example 6 | Example 7 | Example 8 | Comparative Example 1 | Comparative Example 2 |
|---|---|---|---|---|---|
| Bonding yield | 20/20 | 20/20 | 18/20 | 1/20 | 1/20 |

Referring to Comparative Example 1, since toluene having a low boiling point is used as a solvent when the hole transport layer was formed, it can be seen that it is difficult to make a semi-dried state and thus the bonding yield is greatly deteriorated.

On the contrary, referring to Examples 1 to 8, it can be verified that like the present disclosure, even though the first hole transport layer or the second hole transport layer is formed in the semi-dried state as the bonding medium and prepared by the non-deposition method by appropriately selecting the first solvent and the second solvent, a bonded type perovskite solar cell with excellent durability due to greatly excellent bonding yield can be prepared.

The disclosure has been described in detail with reference to embodiments thereof. However, it will be appreciated by those skilled in the art that changes may be made in these embodiments without departing from the principles and spirit of the disclosure, the scope of which is defined in the appended claims and their equivalents. It is therefore intended that the foregoing description be regarded as illustrative rather than limiting, and that it be understood that all equivalents and/or combinations of embodiments are intended to be included in this description.

It is to be understood that the elements and features recited in the appended claims may be combined in different ways to produce new claims that likewise fall within the scope of the present disclosure. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

What is claimed is:

1. A method for preparing a bonded type perovskite solar cell, comprising:

laminating an electron transport layer, a light absorption layer, and a first hole transport layer on a transparent electrode by a non-deposition process to provide a first substrate;

forming a second hole transport layer on an opposing electrode by a non-deposition process to provide a second substrate; and bonding the first substrate and the second substrate to contact the first hole transport layer and the second hole transport layer, wherein the first hole transport layer is formed by coating a solution including a hole conductor and a first solvent on the light absorbing layer, wherein the second hole transport layer is formed by coating a solution including a hole conductor and a second solvent on the opposing electrode, and wherein the bonding is performed while the first hole transport layer is in a semi-dried state.

2. The method for preparing a bonded type perovskite solar cell of claim 1, wherein the light absorbing layer is formed of a compound having a perovskite structure having a chemical formula $AMX_3$, wherein:

A is a monovalent cationic metal ion, a monovalent organic ammonium ion, or a mixture thereof, M is a divalent metal ion, and X is a halogen ion.

3. The method for preparing a bonded type perovskite solar cell of claim 1, wherein the first solvent satisfies at least one of the following conditions (a) to (c):

(a) a boiling point of the first solvent is higher than a boiling point of the second solvent;

(b) a vapor pressure of the first solvent is lower than a vapor pressure of the second solvent; and (c) a volatility of the first solvent is lower than a volatility of the second solvent.

4. The method for preparing a bonded type perovskite solar cell of claim 3, wherein the second solvent is at least one of toluene, benzene, or methylethyl ketone, and wherein the first solvent is at least one of dichlorobenzene, chlorobenzene, or xylene.

5. The method for preparing a bonded type perovskite solar cell of claim 1, wherein the bonding is performed while the second hole transport layer is in a semi-dried state.

6. The method for preparing a bonded type perovskite solar cell of claim 5, wherein the second solvent satisfies at least one of the following conditions (a) to (c):

(a) a boiling point of the second solvent is higher than a boiling point of the first solvent;

(b) a vapor pressure of the second solvent is lower than a vapor pressure of the first solvent; and (c) a volatility of the second solvent is lower than a volatility of the first solvent.

7. The method for preparing a bonded type perovskite solar cell of claim 6, wherein the first solvent is at least one of toluene, benzene, or methylethyl ketone, and wherein the second solvent is at least one of dichlorobenzene, chlorobenzene, or xylene.

8. The method for preparing a bonded type perovskite solar cell of claim 1, wherein the hole conductor is at least one selected from a group consisting of spiro-MeOTAD(2,2',7,7'-tetrakis-(N,N-di-p-methoxyphenyl-amine)-9,9'spirobifluorene), P3HT(poly[3-hexylthiophene]), MDMO-PPV (poly[2-methoxy-5-(3',7'-dimethyloctyloxy)]-1,4-phenylene vinylene), MEH-PPV(poly[2-methoxy-5-(2"-ethylhexyloxy)-p-phenylene vinylene]), P3OT(poly(3-octylthiophene)), P3DT(poly(3-decylthiophene)), P3DDT (poly(3-dodecylthiophene)), PPV(poly(p-phenylene vinylene)), TFB(poly(9,9'-dioctylfluorene-co-N-(4-butyl-phenyl)diphenylamine)), PCPDTBT(poly[2,1,3-benzothiadiazole-4,7-diyl[4,4-bis(2-ethylhexyl-4H-cyclopenta[2,1-b:3,4-b']dithiophene-2,6-diyl)]]), Si-PCPDTBT(poly[(4,4'-bis(2-ethylhexyl)dithieno[3,2-b:2',3'-d]silole)-2,6-diyl-alt-(2,1,3-benzothiadiazole)-4,7-diyl]), PBDTTPD(poly((4,8-diethylhexyloxyl)benzo([1,2-b:4,5-b']dithiophene)-2,6-diyl)-alt-((5-octylthieno[3,4-c]pyrrole-4,6-dione)-1,3-diyl)), PFDTBT(poly[2,7-(9-(2-ethylhexyl)-9-hexyl-fluorene)-alt-5,5-(4',7,-di-2-thienyl-2',1',3'-benzothiadiazole)]), PFO-DBT(poly[2,7-9,9-(dioctyl-fluorene)-alt-5,5-(4',7'-di-2-thienyl-2',1',3'-benzothiadiazole)]), PSiFDTBT(poly[(2,7-dioctylsilafluorene)-2,7-diyl-alt-(4,7-bis(2-thienyl)-2,1,3-benzothiadiazole)-5,5'-diyl]), PSBTBT(poly[(4,4'-bis(2-ethylhexyl)dithieno[3,2-b:2',3'-d]silole)-2,6-diyl-alt-(2,1,3-benzothiadiazole)-4,7-diyl]), PCDTBT(poly [[9-(1-octylnonyl)-9H-carbazole-2,7-diyl]-2,5-thiophenediyl-2,1,3-benzothiadiazole-4,7-diyl-2,5-thiophenediyl]), PFB(poly(9,9'-dioctylfluorene-co-bis(N,N'-(4,butylphenyl))bis(N,N'-phenyl-1,4-phenylene)diamine), F8BT(poly(9,9'-dioctylfluorene-co-benzothiadiazole), PEDOT (poly(3,4-ethylenedioxythiophene)), PEDOT:PSS (poly(3,4-ethylenedioxythiophene):poly(styrenesulfonate)), PTAA (poly(triarylamine)), poly(4-butylphenyl-diphenyl-amine), and copolymers thereof.

9. The method for preparing a bonded type perovskite solar cell of claim 1, wherein, in the bonding, the first substrate and the second substrate are laminated and then dried under conditions of 10° C. to 60° C. and 10 hrs to 30 hrs in a pressurized state.

10. The method for preparing a bonded type perovskite solar cell of claim 1, wherein the transparent electrode is formed by coating at least one of indium tin oxide, fluorine tin oxide, aluminum doped zinc oxide, indium zinc oxide, $ZnO-Ga_2O_3$, $ZnO-Al_2O_3$, or antimony tin oxide on a transparent substrate.

11. The method for preparing a bonded type perovskite solar cell of claim 1, wherein the opposing electrode is formed by coating at least one of indium tin oxide, fluorine tin oxide, aluminum doped zinc oxide, indium zinc oxide, $ZnO-Ga_2O_3$, $ZnO-Al_2O_3$, or antimony tin oxide on a transparent substrate; or a metal electrode made of at least one metal of silver, aluminum, platinum, tungsten, copper, molybdenum, gold, nickel, or palladium.

12. The method for preparing a bonded type perovskite solar cell of claim 1, wherein the electron transport layer is a blocking electron transport layer in which at least one of $TiO_2$, $SnO_2$, ZnO, $WO_3$, $Nb_2O_5$, or $TiSrO_3$ is formed on the transparent electrode in a thin film form.

13. The method for preparing a bonded type perovskite solar cell of claim 12, wherein the electron transport layer further comprises a porous electron transport layer formed by coating a paste including at least one of $TiO_2$, $SnO_2$, ZnO, $WO_3$, $Nb_2O_5$, or $TiSrO_3$ on the blocking electron transport layer.

* * * * *